United States Patent [19]
Tanda

[11] Patent Number: 5,865,904
[45] Date of Patent: *Feb. 2, 1999

[54] FLEXIBLE PHOTOELECTRIC CONVERSION MODULE AND METHOD FOR ITS MANUFACTURE

[75] Inventor: Masayuki Tanda, Kanagawa, Japan

[73] Assignee: Fuji Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 697,145

[22] Filed: Aug. 20, 1996

[30] Foreign Application Priority Data

Aug. 21, 1995 [JP] Japan .................................. 7-211496

[51] Int. Cl.⁶ ............................ H01L 25/00; H01L 31/00
[52] U.S. Cl. .......................... 136/244; 136/256; 257/443; 257/448; 438/98
[58] Field of Search ..................................... 136/244, 256; 257/443, 448; 437/2–5, 51, 205; 438/98

[56] References Cited

U.S. PATENT DOCUMENTS

| | | | |
|---|---|---|---|
| 4,617,420 | 10/1986 | Dilts et al. | 136/244 |
| 4,789,641 | 12/1988 | Inuzuka | 437/4 |
| 5,421,908 | 6/1995 | Yoshida | 136/244 |
| 5,626,686 | 5/1997 | Yoshida | 136/244 |

FOREIGN PATENT DOCUMENTS

| | | | |
|---|---|---|---|
| 6-97474 | 4/1994 | Japan | 136/244 |
| 6-342924 | 12/1994 | Japan | 136/244 |

*Primary Examiner*—Mark Chapman
*Attorney, Agent, or Firm*—Baker & Botts, L.L.P.

[57] ABSTRACT

For reduced electrical resistance of series connections between columns of photoelectric conversion elements in a flexible photoelectric conversion module, the columns are connected by a flexible connecting member which connects terminal electrodes at the ends of the columns. Manufacture of the module is especially convenient when the flexible connecting member is a conductive tape as also used for the terminals.

25 Claims, 7 Drawing Sheets

FLEXIBLE PHOTOELECTRIC CONVERSION MODULE AND METHOD FOR ITS MANUFACTURE

FIELD OF THE INVENTION

The present invention relates to a flexible photoelectric conversion module which includes a plurality of electrically interconnected conversion elements on a flexible substrate, and to a method for manufacturing the module.

BACKGROUND OF THE INVENTION

Amorphous semiconductor films, such as amorphous silicon films, are usually deposited on a substrate from a vapor phase, e.g., by decomposing raw gaseous material by glow discharge. Vapor phase deposition facilitates obtaining a film with a large surface area. Such amorphous semiconductor films have been utilized as photoelectric conversion films in low-cost photoelectric conversion modules. A polymer or metal film used as a flexible substrate facilitates obtaining a thin and light-weight photoelectric conversion module, and facilitates continuous growth of a photoelectric conversion film on an elongated substrate.

Japanese Patent Document No. H06-342924 discloses a module, as shown in FIG. 2, for efficiently generating electric power from an amorphous silicon photoelectric conversion film on a flexible substrate. The module includes a flexible polymer film substrate 1 and a plurality of columns of photoelectric conversion elements on the substrate. The photoelectric conversion elements are formed by dividing a photoelectric conversion film on the flexible substrate, a first electrode layer on the photoelectric conversion film and a second electrode layer between the substrate and the conversion film, into rows and columns. Third electrodes 2 are on the back surface of the substrate 1. A third electrode 2 is connected through holes in the substrate 1 to a transparent first electrode on one of two adjoining elements and to the second electrode between another one of the adjoining elements and the substrate. The third electrodes 2 are formed by dividing a metal electrode layer deposited on the back surface of the substrate 1, except the periphery thereof, into rows and columns.

To connect the columns of the photoelectric conversion elements, a connecting electrode, connected to the first electrode on an end of a column 20 of the connecting electrodes 2, is connected to another connecting electrode, connected to the second electrode on an end of an adjacent column 20 of the connecting electrodes 2. This connection is made by forming inter-column connecting portions 21 consisting of two connecting electrodes connected to each other.

A positive terminal 41 is led out from a positive electrode 31, i.e. a transparent first electrode on an end of one of the outermost columns 20 of the connecting electrodes. A negative terminal 42 is led out from a negative electrode 32, i.e. a second electrode on an end of another one of the outermost columns 20 of the connecting electrodes.

A plurality of the photoelectric conversion modules of FIG. 2 are connected in parallel with wiring 5 as shown in FIG. 3 to obtain an area sufficient to perform a desired photoelectric conversion. The methods for lead-out of the terminals and for parallel connection of the modules are disclosed in Japanese Patent Documents No. H07-22640 and H07-99336.

The photoelectric conversion modules of FIGS. 2 and 3 have the following disadvantages:

(1) For tight bonding of the metal film for the inter-column connecting portion 21, this film is made thin, e.g., of silver 1000 Angstroms thick. As a result, the inter-column connecting portion 21 has considerable electrical resistance. Since only half of the inter-column connecting portion 21 is utilized for photoelectric conversion, the other half is dead or inactive.

(2) Typically, laser patterning is used for dividing the photoelectric conversion film and the electrode layers into rows and columns. Even though the horizontal width of the module is greater than the vertical length, as shown in the figures, sufficient positional precision is still required in patterning longitudinal lines. This is difficult because the substrate tends to deform. Also, the time required for patterning is increased because of position control.

(3) The terminals 41 and 42 are often led out by soldering conductive tape, by bonding conductive tape with conductive adhesive, or by using conductive and adhesive tapes. Adhesives or adhesive tapes tend to exude from their proper locations.

(4) It is necessary to connect wiring 5, in addition to bonding the terminals 41 and 42 for parallel connection. As two kinds of conductors have to be dealt with, the connecting process is complicated, cost is increased, and yield is reduced.

(5) Since the wiring 5 is visible from the outside, the conventional flexible photoelectric conversion module has a poor appearance.

SUMMARY OF THE INVENTION

It is an object of the invention to provide a method of manufacturing a flexible photoelectric conversion module which does not increase the resistance in connecting photoelectric conversion elements and does not reduce the photoelectric conversion area. It is another object of the invention to provide a flexible photoelectric conversion module which facilitates dividing the photoelectric conversion elements, leading out the terminals and connecting the photoelectric conversion elements in parallel. It is a further object of the invention to provide a method for manufacturing the flexible photoelectric conversion module which facilitates dividing the photoelectric conversion elements, leading out the terminals, and connecting the photoelectric conversion elements in parallel.

In accordance with an aspect of the present invention, there is provided a flexible photoelectric conversion module which comprises a flexible substrate; photoelectric conversion elements on a first surface of the flexible substrate, each of the photoelectric conversion elements having a first electrode on a first surface thereof and a second electrode on a second surface thereof, the photoelectric conversion elements being arranged in a plurality of columns and being connected in series in each of the columns; and a flexible connecting member effecting series connection between adjacent columns. Typically, the photoelectric conversion elements are also arranged in rows.

Preferably, the connecting member connects the first electrode on a photoelectric conversion element on a first end of one of the columns and the second electrode on an adjacent photoelectric conversion element on one of the adjacent columns.

Preferably, the flexible photoelectric conversion module further comprises connecting electrodes on a second surface of the substrate, each of the connecting electrodes being connected to the first electrode on a photoelectric conversion element in one of the columns and to the second electrode on an adjacent photoelectric conversion element on the column; and terminal electrodes on the second surface of the substrate, each of the terminal electrodes being connected to the first electrode or the second electrode; wherein the flexible connecting member connects an adjacent pair of the terminal electrodes to one another, one of the pair of terminal electrodes being connected to the first electrode on one of the columns and the other one of the pair of terminal electrodes being connected to the second electrode on another, adjacent column.

Preferred individually or in combination are: a flexible substrate made of a polymer film; a flexible connecting member which is an electrically conductive tape, comprising a metal or alloy, for example; and a flexible connecting member which is supported on the flexible substrate.

Preferably, the flexible photoelectric conversion module further comprises protrusion and cut-out pairs. The pairs are disposed on two parallel sides of the substrate and face each other across the columns. The protrusion and the cut-out are similarly shaped, such that the cut-out is wide enough to engage the protrusion.

Preferably, the protrusion includes a part of the substrate, adjacent conversion elements, first, second and terminal electrodes on the adjacent conversion elements, and the connecting member.

Preferably, the flexible photoelectric conversion module further comprises a pair of terminals, one of the terminals being connected to one of the outermost conversion elements on one of the outermost columns, the other terminal being connected to one of the outermost conversion elements on another one of the outermost columns.

Preferably, the terminals are made of the same material as the flexible connecting member and are supported on the substrate.

Preferably, the flexible photoelectric conversion module further comprises wiring supported on the substrate, the wiring being connected to the terminals.

Preferably, the flexible photoelectric conversion module comprises an insulation layer covering the connecting and terminal electrodes.

Preferably, the terminals have respective exposed portions on respective distal ends thereof, and the exposed portions are connected with the wiring supported on the insulation layer.

Preferably, the flexible photoelectric conversion module further comprises conductors disposed on the exposed portions, the conductors having a surface coplanar with the insulation layer's surface.

Another aspect of the invention involves a method of manufacturing the flexible photoelectric conversion module. The method comprises the steps of laminating a first electrode layer, a photoelectric conversion layer and a second electrode layer on a first surface of the flexible substrate; dividing the photoelectric conversion layer into rows and columns of the photoelectric conversion elements, the first electrode layer into the first electrodes, and the second electrode layer into the second electrodes; connecting the first electrode on the first end of one of the columns and the second electrode on the first end of one of the adjacent columns with the flexible connecting member; and connecting the second electrode on a second end of the one of the columns and the first electrode on the adjacent second end of the other adjacent column with a flexible connecting member.

In accordance with still another aspect of the invention, the method further comprises the steps of forming a third electrode layer on a second surface of the substrate; dividing the third electrode layer into connecting electrodes and terminal electrodes; connecting the connecting electrodes to the first and second electrode; connecting each terminal electrode to either one of the first and second electrodes; and connecting adjacent terminal electrodes with the flexible connecting member, one of the adjacent terminal electrodes being connected to the first electrode and the other one of the adjacent terminal electrodes being connected to the second electrode.

DESCRIPTION OF PREFERRED EMBODIMENTS

Figure 1A:
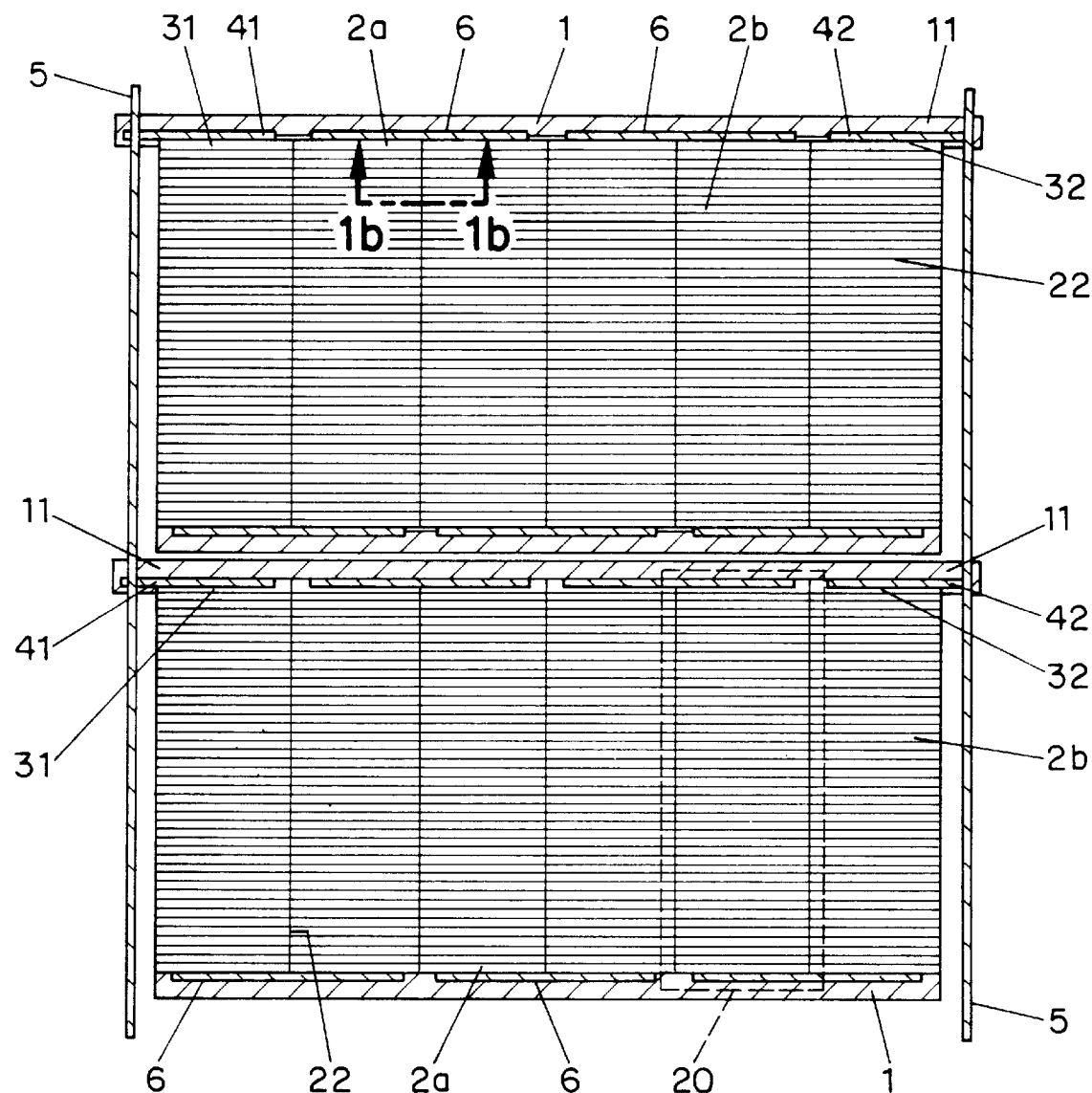
FIG. 1(a) is a back-side plan view of an exemplary assembly of two flexible photoelectric conversion modules connected in parallel, with each module comprising six columns of photoelectric conversion elements, with electrical connections between photoelectric conversion modules at adjacent ends of adjacent columns, for series connection of the columns within each module in accordance with a preferred first embodiment of the invention.
Figure 1B:
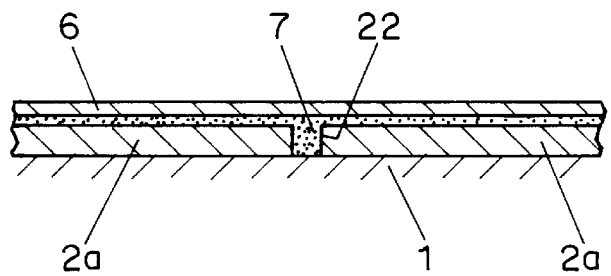
FIG. 1(b) is a partial cross section along A—A of FIG. 1(a), with the back side of the assembly being shown facing up, and not showing the front side of the assembly where the photoelectric conversion elements are disposed.
Figure 2:
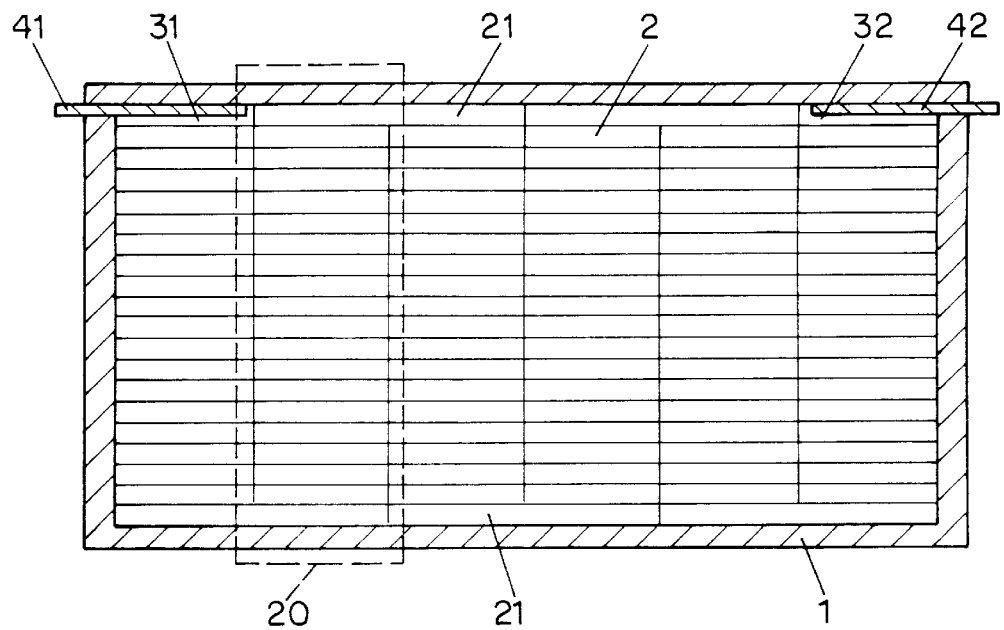
FIG. 2 is a back-side plan view of a conventional flexible photoelectric conversion module.
Figure 3:
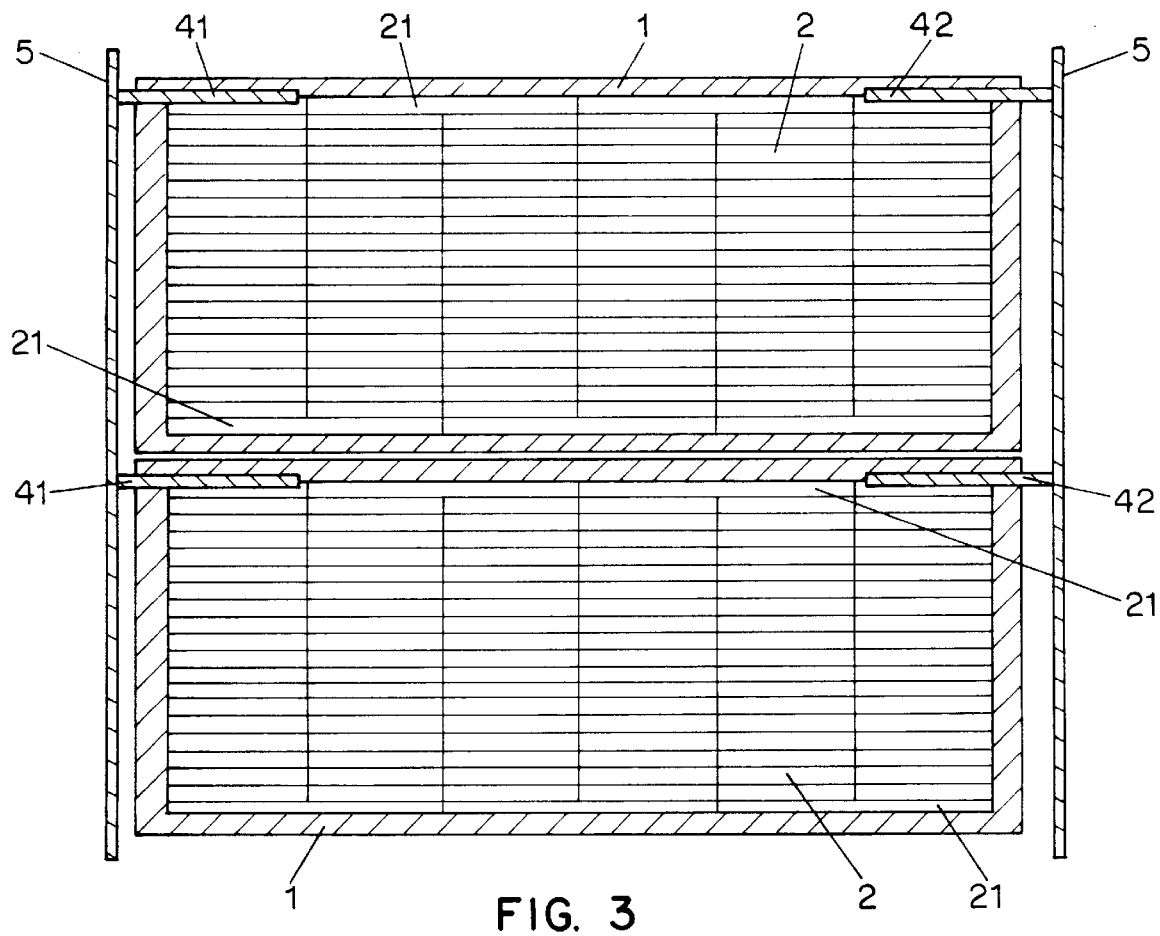
FIG. 3 is a back-side plan view showing parallel connection of conventional flexible photoelectric conversion modules of FIG. 2.

In the flexible photoelectric conversion modules of FIGS. 1(a) and 1(b), photoelectric conversion elements are divided by laser patterning as in the conventional photoelectric conversion module of FIGS. 2 and 3. Terminal electrodes 2a and connecting electrodes 2b are formed by dividing an electrode layer 2. A terminal electrode 2a is connected to a first electrode layer (not shown) on an end of a connecting electrode column 20 for connecting adjoining conversion elements in series. Another terminal electrode 2a is connected to a second electrode layer (not shown) on an end of another connecting electrode column 20. The terminal electrodes 2a, 2a are connected to each other via a flexible connecting member 6. The flexible connecting member 6 is made of the same material as that of terminals 41 and 42 led out respectively from terminal electrodes 31 and 32 on the outermost connecting electrode columns 20. Any flexible material may be used for the flexible connecting member 6 as long as at least the contact planes thereof are electrically conductive. A thin, electrically conductive tape is preferably used for the flexible connecting member 6. The conductive tape is fixed on the electrode plane of the conversion element with solder or conductive adhesive. To reduce costs, a copper tape, aluminum tape or a tape of an alloy of these metals can be used. A thinner tape, e.g. 0.2 mm or less in thickness, is preferable for flexibility. In this embodiment, a copper tape is used for the flexible connecting member 6, bonded with conductive adhesive 7. By filling patterning line 22 between the electrodes formed from electrode layer 2 (terminal electrodes 2a and connecting electrodes 2b) with adhesive 7 as shown in FIG. 1(b), the fixing strength is improved. Insulative tapes such as a polymer tape, ceramic tape, paper tape or cloth tape with conductive adhesive coated thereon can be used in place of the conductive tape. Adhesive tapes can also be used. Materials for the polymer tape include polyimide, polyamide, aramid, polyethylene and poly(ethylene terephthalate). Excellent resistance against adverse environments is obtained by using polyimide and polyamide (i.e., the materials of the flexible substrate 1) for the flexible connecting tape 6. Excellent resistance against adverse environments is also obtained by using tape materials which are different from the substrate material, so long as the tape materials have compatible material properties, such as thermal expansion coefficient, with those of the substrate material. Preferably, the connecting tape 6 has a width of 1 mm to 15 mm, which is wide enough to obtain a strong connection and narrow enough to effectively utilize the module area. The connecting tape 6 is fixed to the module with adhesive tape such as Scotch tape or by laminating with an appropriate material such as ethylene (vinyl acetate).

Figure 4:
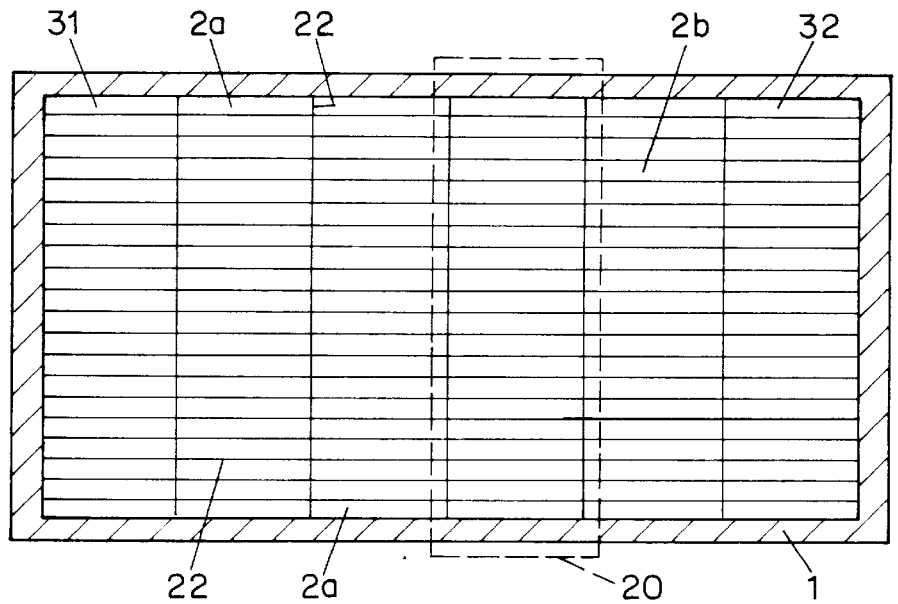
FIG. 4 is a back-side plan view of the photoelectric conversion module of FIGS. 1(a) and 1(b).

By using the above-described connecting tape 6 for connecting the electrode columns 20, the resistance of the connecting portion is less than $10^{-3}$ Ω, which, advantageously, is significantly less than the series resistance of 0.1 to several ohms of the photoelectric conversion element. It is not necessary for the terminal electrode 2a to have a wide area for series connection. Since it is not necessary for the terminal electrodes 2a to be connected beneath the connecting tape 6, the electrode layer 2 can be divided as shown in FIG. 4. As the patterning lines 22 are continuous and straight across the entire photoelectric conversion module of FIG. 4, they can be processed more efficiently because less machining precision is required as compared with the patterning lines of the conventional conversion module of FIGS. 2 and 3. By using the same material for the terminals 41, 42 as for the inter-column connecting tape 6, and by forming the terminals 41, 42 and the inter-column connecting tape 6 by the same process, parallel connection of the copper tapes to the wiring 5 is simplified. The terminals 41 and 42 may be omitted, and the wiring 5 may be directly connected to the electrodes 31 and 32 on the edge of the conversion module. In the first embodiment, a lower part (hereinafter referred to as "protrusion") 11 of the substrate 1 remains below the terminals 41 and 42. Thus, when conductive and adhesive tapes are used for the terminals 41, 42 and the inter-column connecting tape 6, the tapes will only adhere to the substrate 1. By cutting the substrate 1 after the bonding process of the terminals 41, 42 such that the protrusion 11 is left around the substrate 1, the terminals 41, 42 will not protrude from the substrate 1.

A plurality of the flexible photoelectric conversion modules mounted on a roofing may be used for photovoltaic power generation as disclosed in Japanese Patent Document No. H07-45822.

Figure 5:
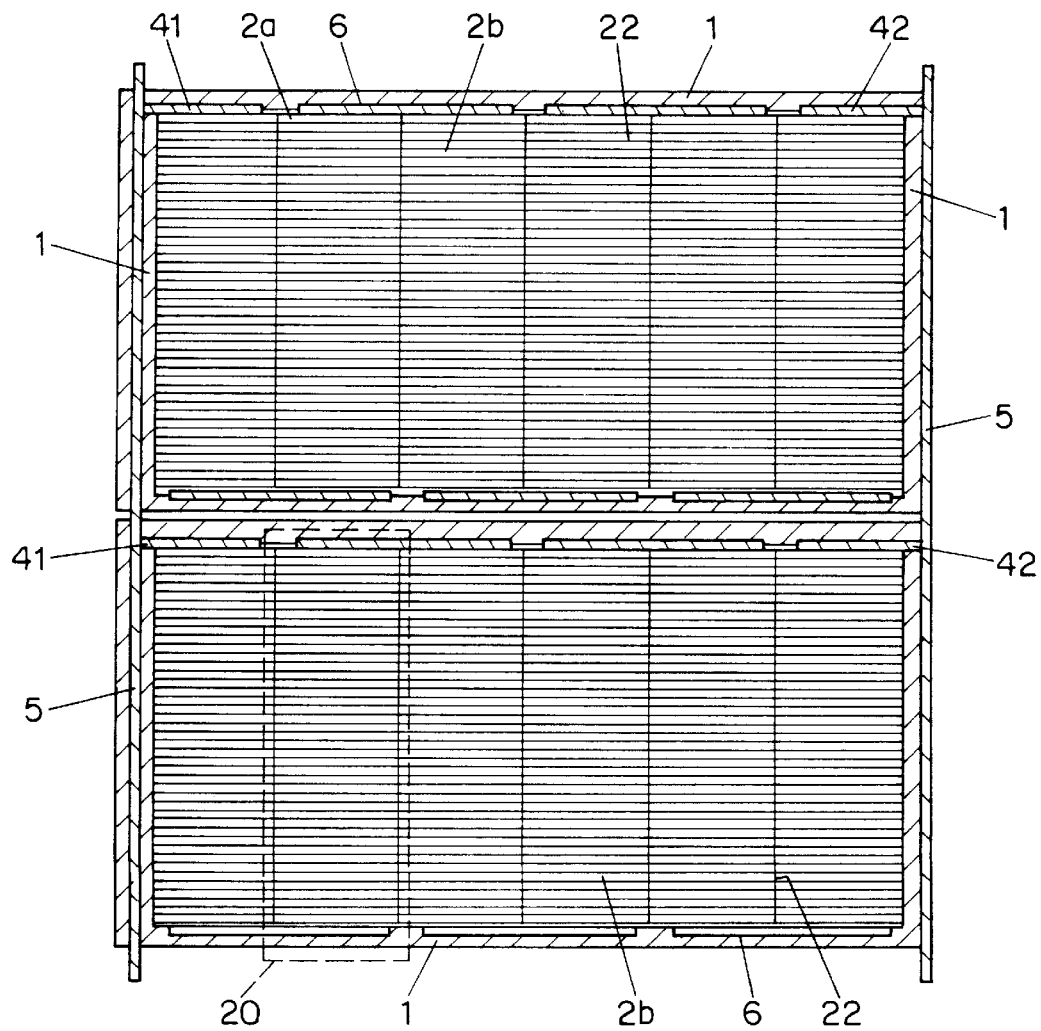
FIG. 5 is a back-side plan view showing parallel connection of two flexible photoelectric conversion modules in accordance with a preferred second embodiment of the invention.

In FIG. 5, the view is from the back side of the modules as in FIG. 1(a). Wiring 5 for parallel connection of the conversion modules is on a substrate 1. Since the wiring 5 is almost invisible from the light-incident front side of the module, the photoelectric conversion module has a neat appearance. Since the substrate 1 is a long rectangle without protrusion 11, the substrate 1 may be cut out by making two sets of perpendicular cuts.

Figure 6:
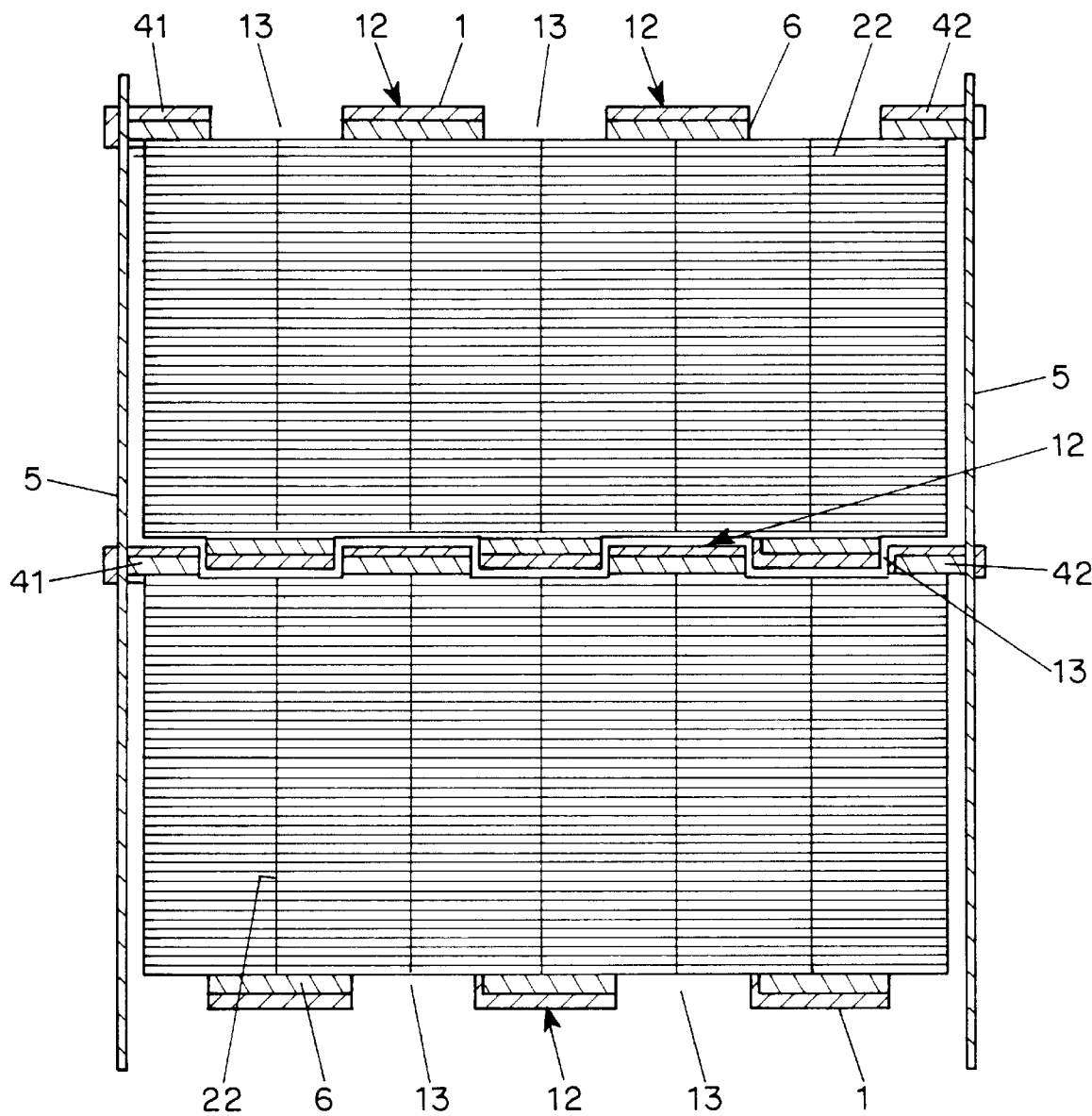
FIG. 6 is a back-side plan view showing parallel connection of two flexible photoelectric conversion modules in accordance with a preferred third embodiment of the invention.
Figure 7A:
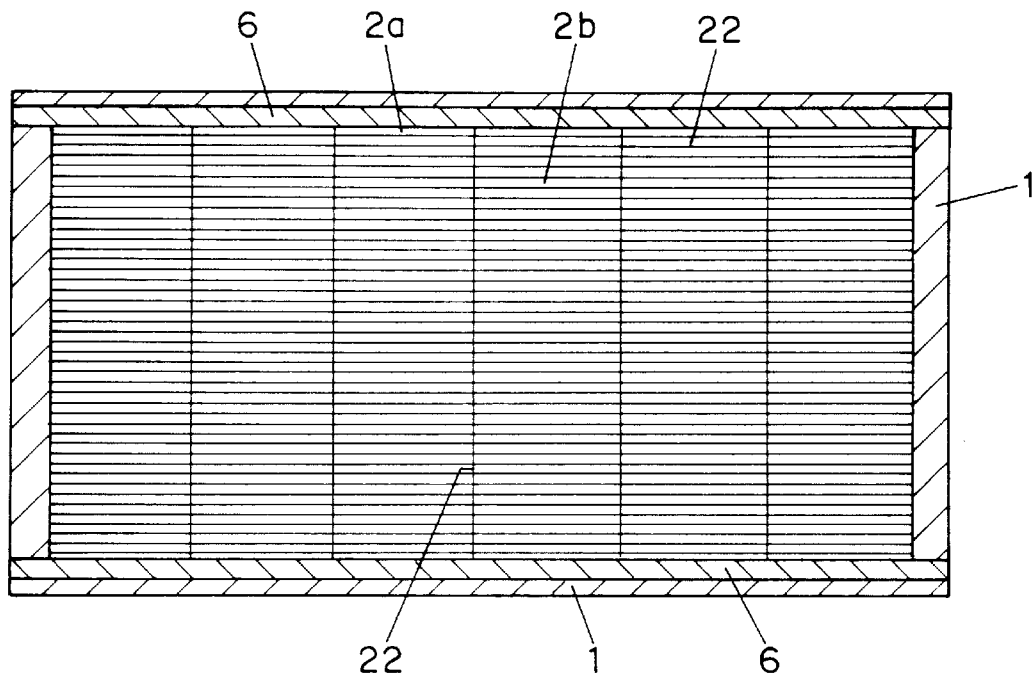
FIGS. 7(a) and 7(b) are plan views illustrating manufacture of the flexible photoelectric conversion module of FIG. 6.
Figure 7B:
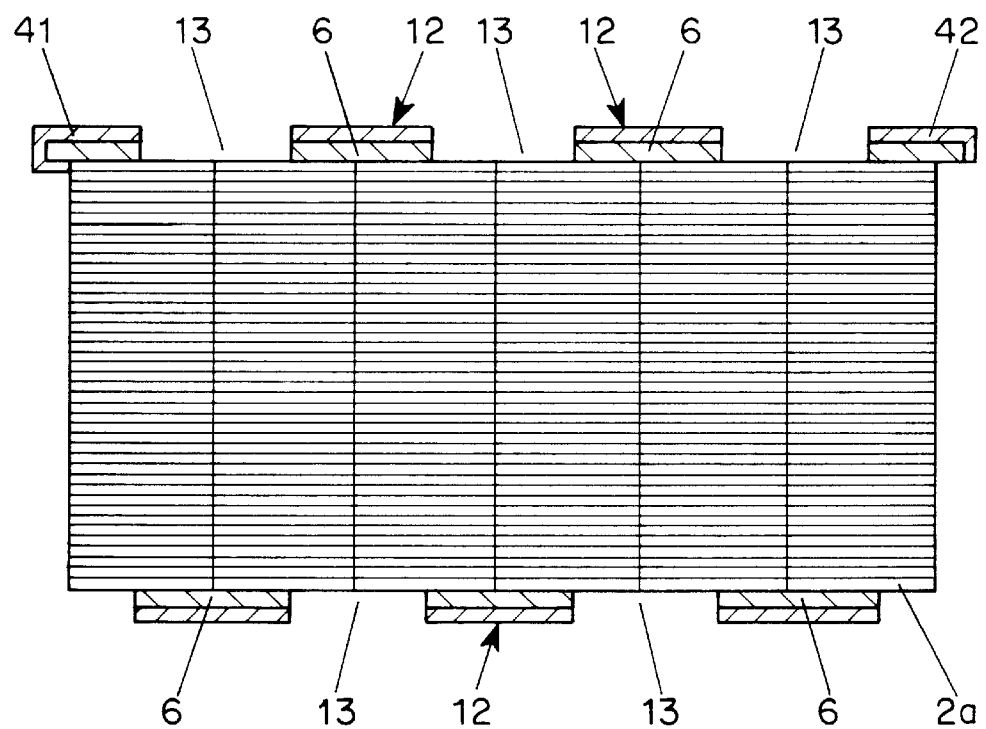

In FIG. 6, the view is from the back side of the modules. Protrusions 12 are formed discontinuously around a substrate 1. The protrusion 12 includes a part of the substrate 1 necessary for series connection, terminal electrodes 2a on the part of the substrate 1, and a flexible connecting tape 6 on the terminal electrodes 2a. The width of the protrusion 12 is narrower than the opening width of cut-out 13 on both sides of the protrusion 12. The photoelectric conversion modules are engaged interdigitally with each other as shown. In this arrangement, the inactive area for the incident light between the photoelectric conversion modules is half the inactive area in FIG. 1(a). The width of the protrusions 12 on both ends and the opening width of the cut-out portions 13 on both ends may be changed for the interdigital engagement as shown in FIG. 7(b). These protrusions and cut-outs are formed as shown in FIG. 7(a), at first by fixing the connecting tapes 6 over opposed facing sides of the substrate 1, and then by cutting out the portions of the substrate 1, terminal electrodes 2a and the connecting tape 6 for the cut-out portions 13 so that the protrusions 12 are left. This method simplifies the process, since it is not necessary to bond the connecting tapes 6 previously cut to the appropriate length.

Figure 8:
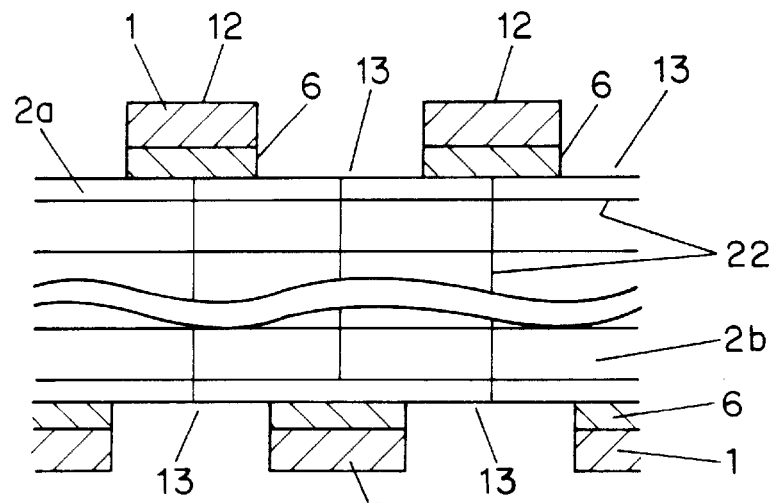
FIGS. 8(a), 8(b) and 8(c) are plan views showing various shapes of the end portions of the flexible photoelectric conversion modules of FIG. 6.
Figure 8:
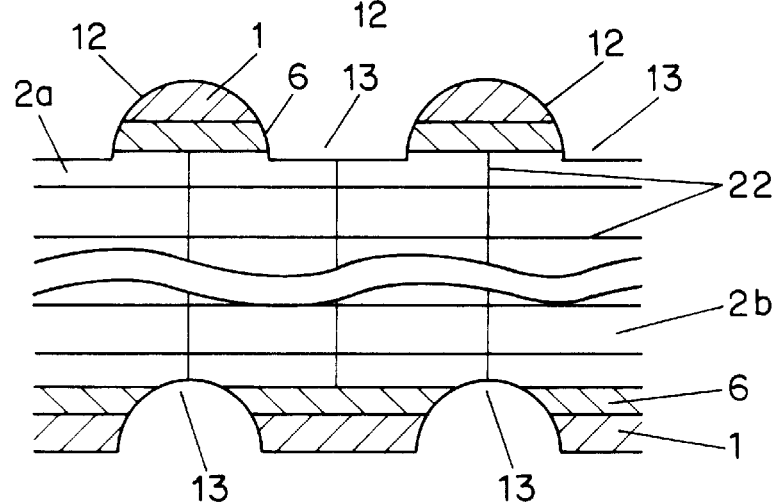
Figure 8:
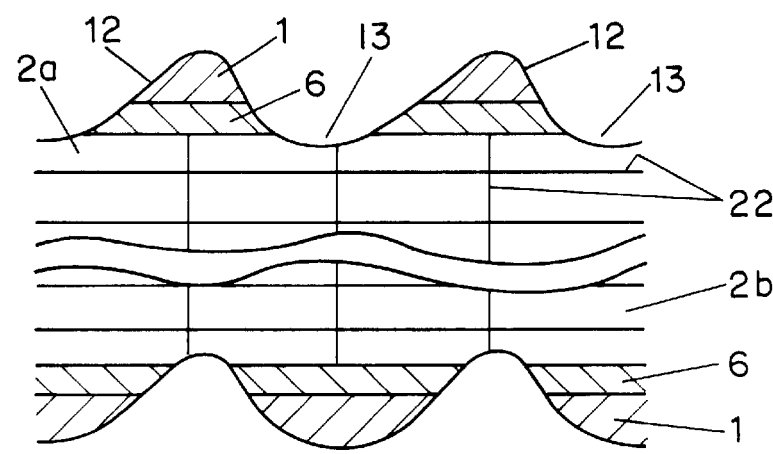

The protrusion 12 and the cut-out 13 may be formed in various shapes such as rectangles as shown in FIG. 8(a), semicircles as shown in FIG. 8(b), and deformed saw tooth as shown in FIG. 8(c). When the cut-out 13 is expanding toward its opening as shown in FIGS. 8(b) and 8(c), the adjoining photoelectric conversion modules are closed to their proximity with a narrow spacing in-between while maintaining an insulation length between the protrusion 12 and the connecting tape 6 of the cut-out 13 even when the cut-out 13 and the protrusion 12 have the same shape. Thus, the inactive area is minimized.

Figure 9:
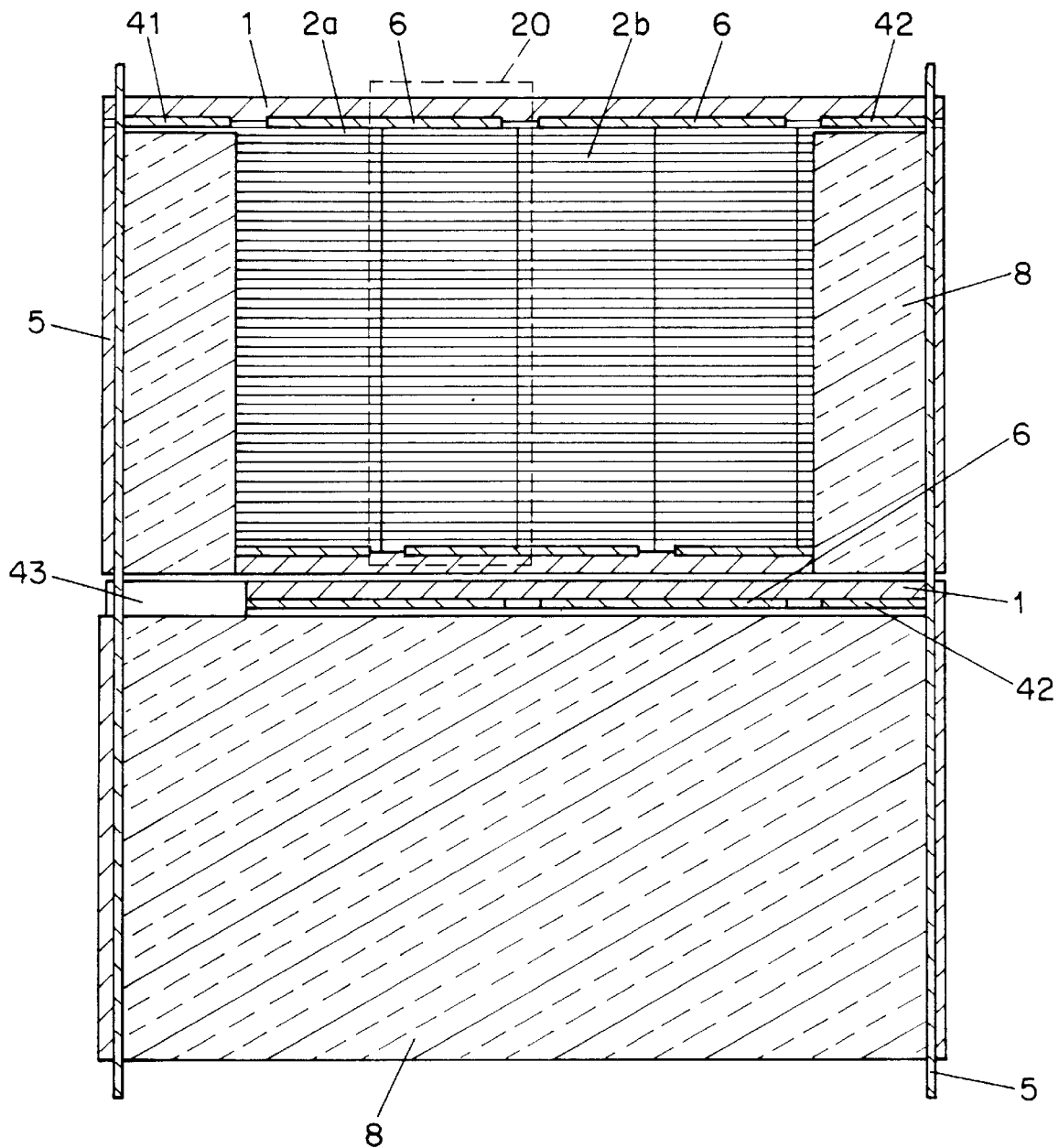
FIG. 9 is a back-side plan view showing parallel connection of two flexible photoelectric conversion modules in accordance with a preferred fourth embodiment of the invention.

In FIG. 9, the view is from the back side of the modules. Connecting electrode columns 20 are connected to each other at their ends with flexible connecting tapes 6. Then, the outermost electrode columns 20 are covered with insulation layers 8 as shown on the upper photoelectric conversion module of FIG. 9. Alternatively, all the electrode columns 20 are covered with insulation layers 8, as shown on the lower conversion module of the figure. In both configurations, terminals 41 and 42 are exposed; i.e., the terminals 41 and 42 are not covered with the insulation layer 8. Then, the photoelectric conversion modules are connected in parallel with wiring 5 extending on the insulation layer 8. When there is a step between upper faces of the terminal 41 or 42 and the insulation layer 8, a conductor 43 is disposed on the terminal 41 or 42 to fill the step. Laminate material such as ethylene(vinyl acetate), polymer films, ceramic films, polytetrafluoroethylene film, paper and cloth are used for the insulation layer 8. The polymer films include films of polyimide, polyamide, aramid, polyethylene and poly (ethylene terephthalate). The materials for the flexible connecting member 6 of the first embodiment are useful for the materials of the conductor 43. In the configuration of FIG. 9, the wiring 5 is almost invisible from the light-incident side in the same manner as in the second embodiment. The back side of the photoelectric conversion module is used for wiring to reduce the inactive area.

The following are among benefits realizable in accordance with the invention:

By connecting in series, not with thin electrode layers but with flexible connecting members, the columns of series-connected photoelectric conversion elements are connected in series with low resistance, with the flexible connecting members tightly fixed to the flexible substrate. This inter-column connection results in reduced inactive area for photoelectric conversion and does not impair the flexibility of the photoelectric conversion module.

The columns of the conversion elements are connected in series by directly connecting the first and second electrodes of the elements on an end of adjacent columns or, alternatively, by indirectly connecting the electrodes using the terminal electrodes.

When protrusion and cut-out pairs are used, the protrusion affords a sufficient area for inter-column connection. The end portions of the substrate which are not used for the inter-column connection are cut out to reduce the unused area of the substrate and to utilize the space efficiently. A plurality of the photoelectric conversion modules are engaged with each other through the protrusions and cut-outs, and connected in parallel within a minimum of occupied area. The protrusions and cut-outs are formed easily in a late stage of manufacturing.

With the terminal and the flexible connecting member of the same material, the connections between the element columns and the connections between the photoelectric conversion modules can be made in one step. By supporting the terminals and the wiring connected to the terminals on the substrate, parallel connection of a plurality of modules is stabilized. By supporting the wiring on the substrate, the substrate may be shaped rectangular, for easy machining.

By using the terminal electrodes for connecting the conversion elements and by supporting the wiring for inter-module connection on the substrate, the module has a neat appearance, as the wiring is invisible from the front side of the module. Alternatively, by covering the third electrodes with an insulation layer and supporting the wiring on the insulation layer, the wiring is invisible from the front side of the module. With the conductor disposed on the terminal so as to fill the gap between the terminal and the insulation layer, module wiring is facilitated.

As described, the present invention utilizes a flexible connecting member for connecting the columns of photoelectric conversion elements connected in series on a flexible substrate, and reduces the resistance of the connection between the conversion element columns more effectively than by the prior art which connects the conversion element columns with electrode layers. Connection resistance is reduced without reducing the active area effective for photoelectric conversion. Less machining precision is required and higher machining efficiency is realized, as it is not necessary to stop drawing the scriber lines for dividing so that some parts of the electrode layers may be left undivided. As the same material can be used for the flexible connecting member, terminals and wiring, the connecting process is simplified. Photoelectric conversion performance is improved and the manufacturing costs of the photoelectric conversion module are greatly reduced without impairing the flexibility of the module.

Though the invention has been described by way of improvements over the flexible photoelectric conversion module disclosed in Japanese Patent Document No. H06-342924 which uses connecting electrodes on the back surface of the substrate, the present invention is applicable also to connecting, on the substrate surface on which the photoelectric conversion layer is formed, the first and second electrodes on the ends of the conversion element columns. Other modifications of the invention will occur to those skilled in the art and it is intended that the scope of the invention be limited only as set forth in the appended claims.

I claim:

1. A flexible photoelectric conversion module comprising:
   a flexible substrate having a first substrate surface and a second substrate surface;
   a plurality of photoelectric conversion elements on the first substrate surface, each of the photoelectric conversion elements having a first electrode on a first photoelectric conversion element surface and a second electrode on a second photoelectric conversion element surface, the photoelectric conversion elements being aligned in a plurality of columns;
   a plurality of third electrodes formed in an electrode layer on the second substrate surface, the plurality of third electrodes connecting the plurality of photoelectric conversion elements in series in each of the columns; and
   a flexible connecting member, not part of the electrode layer and having a conductivity greater than the conductivity of each of the third electrodes, completing an electrical connection between (i) the first electrode of a first photoelectric conversion element at a first end of a first column and (ii) the second electrode of a second photoelectric conversion element adjacent to the first photoelectric conversion element at an end of a second column adjacent to the first end of the first column, whereby the photoelectric conversion elements in the first column and the second adjacent column are connected in series.

2. The flexible photoelectric conversion module according to claim 1, wherein the photoelectric conversion elements are further aligned in rows.

3. The flexible photoelectric conversion module according to claim 1, wherein the substrate comprises a polymer film.

4. The flexible photoelectric conversion module according to claim 1, wherein the flexible connecting member is supported on the substrate.

5. The flexible photoelectric conversion module according to claim 1, wherein (i) the one of the electrodes of the first photoelectric conversion element is one of the first electrodes and (ii) the one of the electrodes of the adjacent photoelectric conversion element is one of the second electrodes.

6. The flexible photoelectric conversion module according to claim 5, wherein the flexible connecting member comprises an electrically conductive tape.

7. The flexible photoelectric conversion module according to claim 6, wherein the conductive tape comprises a metal.

8. The flexible photoelectric conversion module according to claim 6, wherein the conductive tape comprises an alloy.

9. The flexible photoelectric conversion module according to claim 1, wherein the plurality of third electrodes further comprises:
   connecting electrodes on the second surface of the substrate, each of the connecting electrodes being connected to the first electrode on a photoelectric conversion element in one of the columns and to the second electrode on an adjacent photoelectric conversion element in the one of the columns; and terminal electrodes on the second surface of the substrate, each of the terminal electrodes being connected to the first electrode or the second electrode on one of the photoelectric conversion elements, wherein the flexible connecting member connects an adjacent pair of terminal electrodes in adjacent columns to one another, one of the pair of terminal electrodes being connected to the first electrode on one of the photoelectric conversion elements in one of the adjacent columns and the other one of the pair of terminal electrodes being connected to the second electrode on another photoelectric conversion element in the other of the adjacent columns.

10. The flexible photoelectric conversion module according to claim 9, wherein the flexible connecting member is formed on the terminal electrodes supported on the substrate.

11. The flexible photoelectric conversion module according to claim 10, wherein the terminal electrodes are divided by patterning lines.

12. The flexible photoelectric conversion module according to claim 10, wherein the terminal electrodes are not divided by patterning lines.

13. The flexible photoelectric conversion module according to claim 9, wherein the flexible connecting member comprises an electrically conductive tape.

14. The flexible photoelectric conversion module according to claim 13, wherein the conductive tape comprises a metal.

15. The flexible photoelectric conversion module according to claim 13, wherein the conductive tape comprises an alloy.

16. The flexible photoelectric conversion module according to claim 9, further comprising a pair of terminals, one of the terminals being connected to an outermost one of the conversion elements on an outermost one of the columns, the other one of the terminals being connected to an outermost one of the conversion elements on another outermost one of the columns, wherein the terminals are made of the same material as the flexible connecting member.

17. The flexible photoelectric conversion module according to claim 16, wherein the terminals are supported on the substrate.

18. The flexible photoelectric conversion module according to claim 17, wherein said substrate is non-conductive, and further comprising intermodule wiring supported directly on the substrate, the wiring being connected to the terminals.

19. The flexible photoelectric conversion module according to claim 18, further comprising an insulation layer covering the connecting electrodes and the terminal electrodes.

20. The flexible photoelectric conversion module according to claim 19, wherein the terminals comprise respective exposed portions on respective distal ends thereof, the exposed portions being connected with the wiring supported on the insulation layer.

21. The flexible photoelectric conversion module according to claim 20, wherein the insulation layer has an insulation surface, the flexible photoelectric conversion module further comprising conductors disposed on the exposed portions, the conductors having a surface coplanar with the insulation surface.

22. The flexible photoelectric conversion module according to claim 1, further comprising pairs of a protrusion and a cut-out, the pairs being disposed on two parallel sides of the substrate, the protrusion and cut-out of a pair being disposed across from each other across the columns and being similarly shaped such that the cut-out is wide enough to engage the protrusion.

23. The flexible photoelectric conversion module according to claim 22, wherein the protrusion comprises a part of the substrate, adjacent conversion elements, first, second and terminal electrodes on the adjacent conversion elements, and the flexible connecting member.

24. A method for manufacturing a flexible photoelectric conversion module, comprising:

laminating a first electrode layer, a photoelectric conversion layer and a second electrode layer on a first surface of a substrate;

dividing the photoelectric conversion layer into rows and columns of photoelectric conversion elements, the first electrode layer into first electrodes, and the second electrode layer into second electrodes;

forming a third electrode layer on the second surface of the substrate;

dividing said third electrode layer into third electrodes;

connecting the photoelectric conversion elements in series in each of the columns with said third electrodes;

connecting the first electrode on a first end of one of the columns and the second electrode on an adjacent end of an adjacent one of the columns via a flexible connecting member, said flexible connecting member being not part of the third electrode layer and having a conductivity greater than the conductivity of each of the third electrodes; and connecting the second electrode on a second end of the one of the columns and the first electrode on an adjacent second end of a further adjacent one of the columns via a flexible connecting member, said flexible connecting member being not part of the third electrode layer and having a conductivity greater than the conductivity of each of the third electrodes.

25. The method according to claim 24, wherein the third electrodes are aligned in columns, each column of third electrodes comprising terminal electrodes at its ends and connecting electrodes in between the terminal electrodes, and further comprising:

connecting the connecting electrodes to the first and second electrodes;

connecting each of the terminal electrodes to either one of the first and second electrodes; and connecting adjacent pairs of the terminal electrodes with the flexible connecting member so that one of the adjacent terminal electrodes is connected to the first electrode and the other one of the adjacent terminal electrodes is connected to the second electrode.

* * * * *